United States Patent [19]
Call et al.

[11] Patent Number: 5,309,461
[45] Date of Patent: May 3, 1994

[54] COMPENSATED LASER DRIVE CIRCUIT

[75] Inventors: David E. Call; Glen A. Jaquette; Julian Lewkowicz, all of Tucson, Ariz.

[73] Assignee: International Business Machines Corporation, Armonk, N.Y.

[21] Appl. No.: 921,894

[22] Filed: Jul. 29, 1992

[51] Int. Cl.⁵ .............................................. H01S 3/00
[52] U.S. Cl. ...................................................... 372/38
[58] Field of Search .................... 372/38, 29; 369/106

[56] References Cited

U.S. PATENT DOCUMENTS

4,114,180 9/1978 Kayanuma et al. .
4,480,325 10/1984 Aiki et al. .
4,712,218 12/1987 Ohnuki et al. .
4,754,460 6/1988 Kimura et al. .
4,819,242 4/1989 Kaku et al. .

Primary Examiner—Rodney B. Bovernick
Assistant Examiner—Robert E. Wise
Attorney, Agent, or Firm—Greenlee and Winner

[57] ABSTRACT

A drive circuit for a laser which has the capability of eliminating transient conditions when switching a high frequency modulator on or off, and including elements for maintaining desired depth of modulation. These capabilities are included in a circuit that automatically compensates for changing conditions due to temperature, laser characteristics and fluctuations in media reflectivity.

14 Claims, 8 Drawing Sheets

COMPENSATED LASER DRIVE CIRCUIT

This invention relates to a laser drive circuit for optical disk media that eliminates transients when switching the high frequency modulation on and off, which includes the automatic calibration of high frequency modulation, and which is automatically compensated for changes in temperature and media reflectivity.

BACKGROUND OF THE INVENTION

Optical disk devices are used for the storage of computer-prepared data and have recognized value in their ability to store large quantities of data. The media for use in such devices is reactive to bursts of light, such as may be produced by the rapid switching of a semiconductor laser. In order to write data on optical media, the laser power must be controlled at a fairly high power level, in order that the media can be altered so that it reflects light indicating the presence or absence of data. In reading the data back, the laser power level is controlled to a lower level so that the media is not altered by the laser beam.

Optical media is of two general types, media which can be written only once and media which can be written, erased, and written again. Write-once media (WORM) is permanently altered when write power levels are produced by the laser beam. Erasable media, such as magneto-optic (MO) media, is not permanently altered when data is written. In the MO media, the magnetic orientation of the reactive material is altered in the writing process, and in the erasing process, the magnetic orientation is reordered.

In operating an optical disk system, it is necessary to set the correct laser power level to read and to write for each optical disk. The correct parameters for the optical disk are included in information in an identification header stamped onto the disk, itself. That information, when read by the system, enables a calibration circuit to set the desired current levels for the laser to produce correct laser power. Since, however, the laser is subject to unintended changes in its operating parameters, particularly with temperature and aging, the calibration method is also used to change current levels for the laser so that the correct power level is maintained under operating conditions and throughout laser life.

The common practice of calibrating laser circuits to operate with a given optical medium usually involves analyzing the laser light intensity at the optical medium. To do that, laser control circuits are set to match a predetermined or desired light intensity at the optical medium. Analysis is conducted to enable setting digital-to-analog converters (DACs) which control laser power in the writing and the erasing operations of optical mediums.

Read power levels and the power level to write zero digits, called a baseline level, are also established. However, as the efficiency of the laser changes, the read power produced for a given laser current changes. Changes in efficiency result from the laser moving in and out of focus, a situation causing feedback noise within the system. Noise is created from small variations in the optical path length which occur as an optical disk rotates and also by differing reflections from the media. The semiconductor laser chip, itself, may be inherently unstable in that emission from the laser may be reflected back into a secondary cavity with the consequence that read power emitted by the laser may fluctuate.

In order to eliminate the effects of feedback noise, it is common practice to modulate the laser, that is to turn the laser off as light is returned to the laser cavity from the optical disk medium. The instant invention relates, in part, to automatically calibrating the amplitude of the modulation, that is modulation depth, so that a correct modulation depth is maintained in the system without manual intervention. Thus, a technique is presented in which the laser driver, itself, may calibrate the modulation depth as temperature changes, as the read power level changes, and as laser characteristics change, for example, with age.

A provision is also made for compensation to eliminate switching transients as laser power is switched from one power level to another. For example, when the power level is switched from a read power level for MO media to a baseline write power level, laser current and power may fluctuate during a transient period. This invention provides a circuit which effectively eliminates such transients.

SUMMARY OF THE INVENTION

Briefly stated, this invention is a laser driver circuit for optical disk media used for storing digital data where the disk media may be write-once or erasable. The circuit includes elements to monitor output laser power during the transient period after the high frequency modulator is turned on or off in order to produce an error voltage, if any, in accordance with the laser output and a reference value. That error voltage is used to stimulate a circuit for eliminating transient conditions in laser output when switching from a read operation to a write operation or vice versa. The error voltage is also used to stimulate a circuit for controlling the depth of high frequency modulation to a desired level. Since the error voltage changes with laser output, ambient temperature and the gain of the laser cavity are factored into the elimination of transients and into the control of modulation depth.

DETAILED DESCRIPTION

When reference is made to the drawing, like numerals will indicate like parts and structural features in the various figures.

Figure 1:
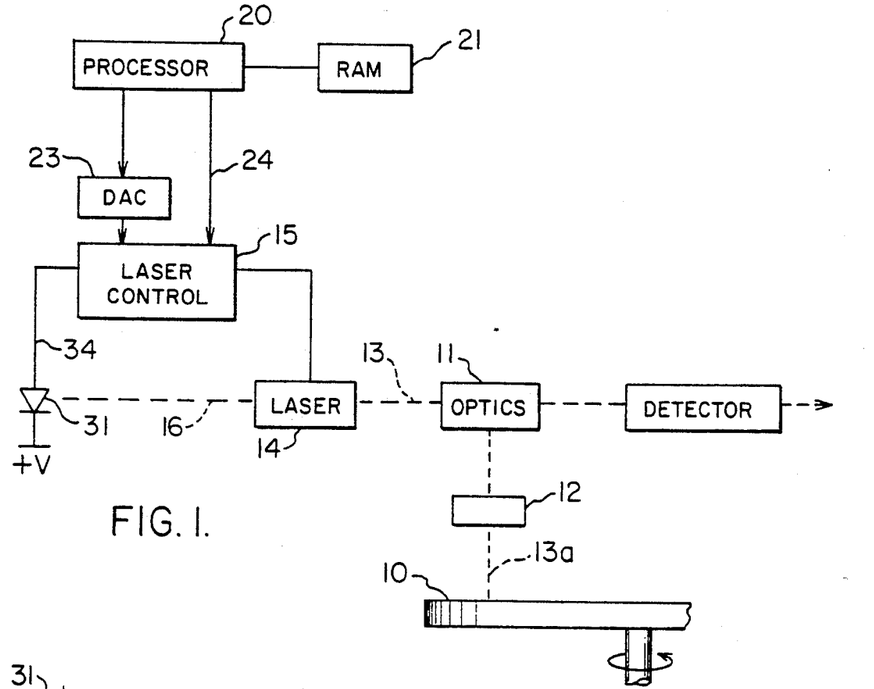
FIG. 1 is a block diagram of a control circuit for laser drive current.

In FIG. 1, an optical disk 10 is suitably mounted for rotation in an optical disk recorder, the mechanical details of which are not shown. FIG. 1 shows a laser generator 14 producing a main light beam over light path 13 to an optical system 11 which includes the usual beam splitters and the like, for supplying the light beam generated by laser 14 through objective lens 12 over light path 13a to disk 10. Light reflected from disk 10 travels over the same path 13a and objective lens 12 to optical system 11 and back over light path 13 to the laser 14.

The system shown in FIG. 1 is under control of a programmed processor 20 which has a random access memory (RAM) 21. Microprocessor 20 supplies a digital value to digital to analog converter (DAC) 23. DAC 23 supplies an analog signal to the laser control circuit 15 for setting the beam intensity emitted by laser 14 to optical elements 11. Such laser output light intensity includes modulation based upon data as supplied by microprocessor 20 or other data handling circuits. Control line 24, extending from processor 20 to the laser control circuits 15, signifies additional mode control for controlling the laser control circuits 15.

Laser generator 14 is controlled in intensity by a feedback circuit in laser control 15. The laser 14 emits an auxiliary beam over light path 16 to a photodiode 31. The photo-current amplitude produced from photodiode 31 varies in accordance with the light power produced from laser 14 (which is a function of the amount of light fed back into the laser, though reflected light is not coupled to the photodiode 31). The output of photodiode 31 is a representation of the light power output of laser 14, and is connected to laser control circuit 15. Under normal operations, laser control 15 responds to the signal level on line 34 to maintain the operation of the laser 14 at predetermined light intensity values.

As mentioned above, semiconductor lasers, used in optical recording, are sensitive to laser light feedback. The effect of such feedback is to change the output laser power and thus increase laser noise. This is an especially significant problem in MO drives, where the reflected light cannot be eliminated, and up to 7% of the light is reflected back to the laser. One well-known technique for reducing laser noise is to modulate the laser with a high frequency signal, such that the laser is turned off when it receives reflected light, and turned back on to produce light after the feedback is passed. To adequately control laser noise, the modulation depth must be controlled. A definition of modulation depth (MD) is:

$$\% \text{ MD} = [P2/P1] \times 100\% \text{ for } \% \text{ MD} > 100\% \quad (1)$$

where % MD is the modulation depth expressed in percentage, P2 is the laser power with modulation at a DC-bias laser current I1, and P1 is the laser power without modulation at the same laser DC-bias current I1. This definition is valid for modulation depth greater than 100%, but loses meaning when P1 is 0. Prior art practice is to set the modulation depth at the time of manufacture, by adjusting an analog potentiometer to control the amplitude of high frequency current. With that method, modulation depth can be set to a specific value, for example, 200%, at a specific read power level, for example, 2 milliwatts (mW). However, with this prior art technique, if the read power level is changed after the modulation depth has been set, modulation depth is no longer at the original depth. Also as temperature changes or as the laser ages, the modulation depth will vary. The prior, art technique does not fully compensate for transients occurring when switching from read to write operations or vice versa.

Figure 2:
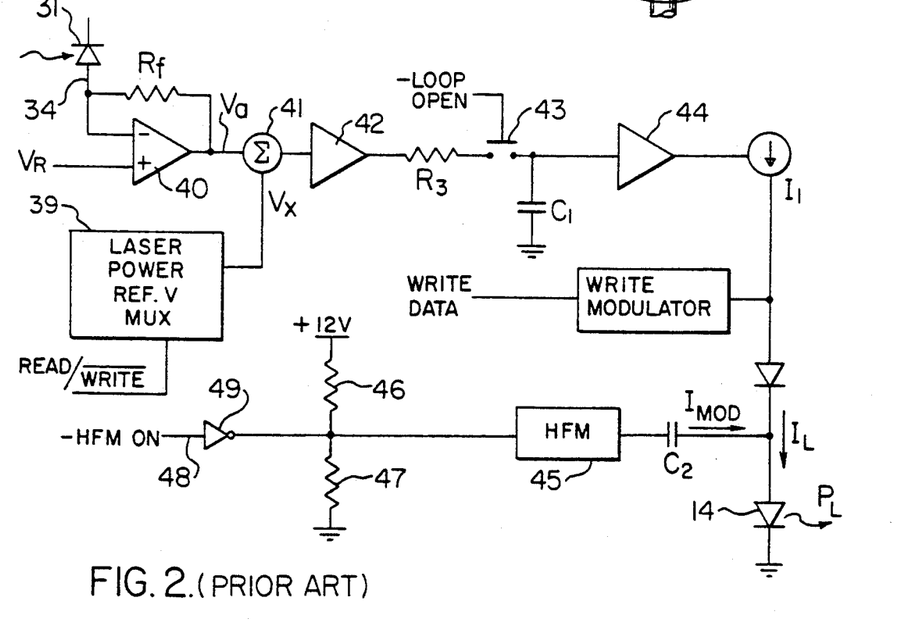
FIG. 2 is a circuit diagram of a prior art laser power servo system.

FIG. 2 is a representation of a prior art circuit for use as the laser control 15 in FIG. 1. Laser 14 emits light with a power level $P_L$, and a portion of that light is received at photodiode 31. The photoconductor current $I_{pd}$ present on line 34 is proportional to the amount of light received by the photodetector 31. That current is fed into a transimpedence amplifier 40. Amplifier 40 drives an output voltage $V_a$ such that $V_a$ is equal to the reference voltage $V_R$ minus the voltage drop across $R_F$ which is proportional to the current produced by photodetector 31. The operation of the laser power servo loop, shown in FIG. 2, is to force the current produced by the photodetector to a level such that $V_A$ is substantially equal to a reference power voltage $V_X$. $V_a$ is provided to a summing circuit 41, where the difference from a power reference voltage $V_X$ is produced for use as an error voltage in the system. That is to say the difference between $V_a$ and $V_X$ is representative of an error voltage.

$V_X$ is the laser power reference voltage, which may be, for example, a voltage proportional to a 2 milliwatt production by laser 14 for a read operation, or a voltage which is proportional to a 0.5 milliwatt production by laser 14 for a baseline Write operation. By "baseline write", it is meant that during a write operation, a zero is written on the optical disk. The multiplexor 42 provides whichever reference voltage is needed to the summing circuit 41. The error voltage, that is the output of summing circuit 41, is amplified by amplifier 42, and with the loop closed by digital switch 43, the error voltage appears across capacitor $C_1$. The voltage is then amplified by transconductance amplifier 44 to produce a current $I_1$ which is modified in accordance with the error voltage. With the system in balance, $I_1$ will be at a current level that drives laser 14 to produce a power output that is at a level for producing a zero error voltage.

During a write operation, when a one digit is to be written, the current through the laser is modulated to produce, for example, ten milliwatts of power as opposed to the baseline write (zero digit) power level of 0.5 milliwatts. Therefore, each time a one digit is to be written on the optical disk, the current level $I_L$ is switched from that level needed to produce 0.5 milliwatts to a level needed to produce 10 milliwatts.

The loop open switch 43 is operated to open the loop during a write operation, since the circuit is designed to maintain laser power at a read power level of, for example, 2 milliwatts, or at a baseline write level of 0.5 milliwatts.

The high frequency modulation (HFM) circuit shown in FIG. 2 is comprised of an oscillator 45, the gain of which is controlled by a voltage dividing circuit through resistors 46 and 47. This circuit is on during a read operation, and off during a write operation. During the read operation, control signal 48 enables HFM oscillator 45 When the HFM control signal 48 is low, open collector inverter 49 produces a high output, or that is, an output which is at a floating value determined by the voltage dividing circuit. In such case, the level of voltage produced by the voltage divider drives the oscillator 45 to produce an output which is AC-coupled by capacitor $C_2$ into the laser power circuit, where the current due to modulation is added to $I_1$ to produce the current $I_L$ for driving the laser. Basically, the depth of modulation is controlled by the voltage dividing network since that network sets the gain of the high frequency oscillator to establish the amplitude of the modulation.

Figure 3:
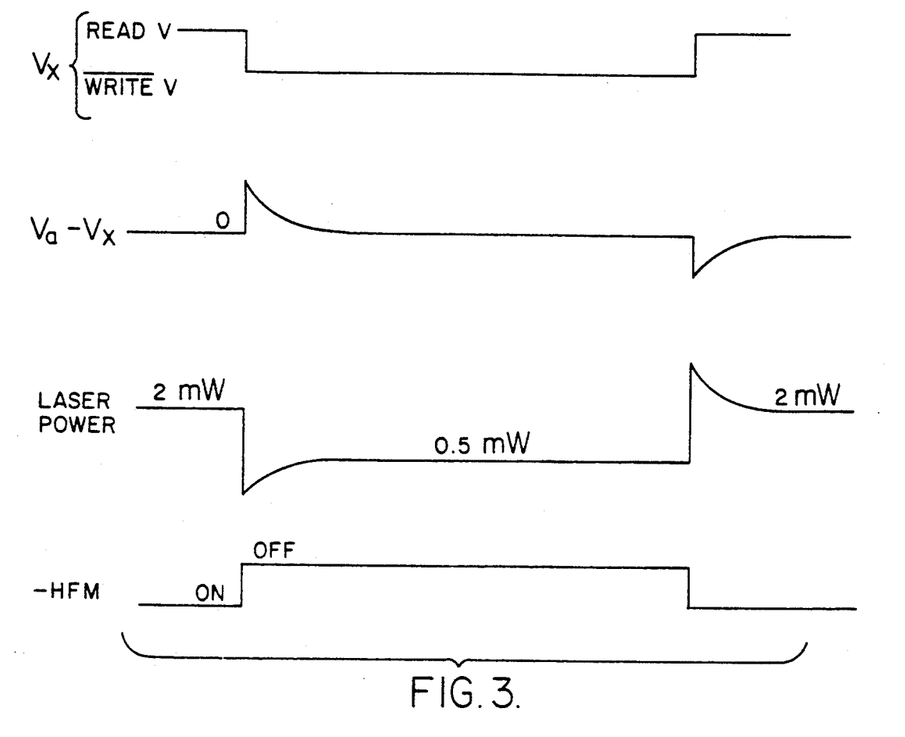
FIG. 3 is a diagram of voltage and power showing typical operation for the circuit of FIG. 1 when writing MO media.

FIG. 3 shows typical waveforms that can be expected when the high frequency modulation is switched off, and the laser power setting is simultaneously switched from a read power level to a baseline write power level. This case is typical of an MO disk where, for example, the sector header may be typically read with 2 milliwatts of laser power with the high frequency modulation on, while the data field may be written from a 0.5 milliwatt threshold with the high frequency modulator off. The lower power setting and the turning of the modulator off are done to reduce noise during a write operation. The waveforms shown in FIG. 3 are for a situation where the depth of modulation is more than enough to offset the drop in power setting from 2 milliwatts to 0.5 milliwatts. It is noted that dropping the power level creates a transient condition, and so does the turning off of the high frequency modulation. These two transient conditions could cancel each other, however, they typically do not. In order to eliminate the transient, the inventors herein have provided another source of power to the laser to produce a current $I_2$. If the circuits are set correctly, the power due to $I_2$ will eliminate the transient and thus produce a zero error voltage when switching power setting levels and turning high frequency modulating power on and off.

Figure 4:
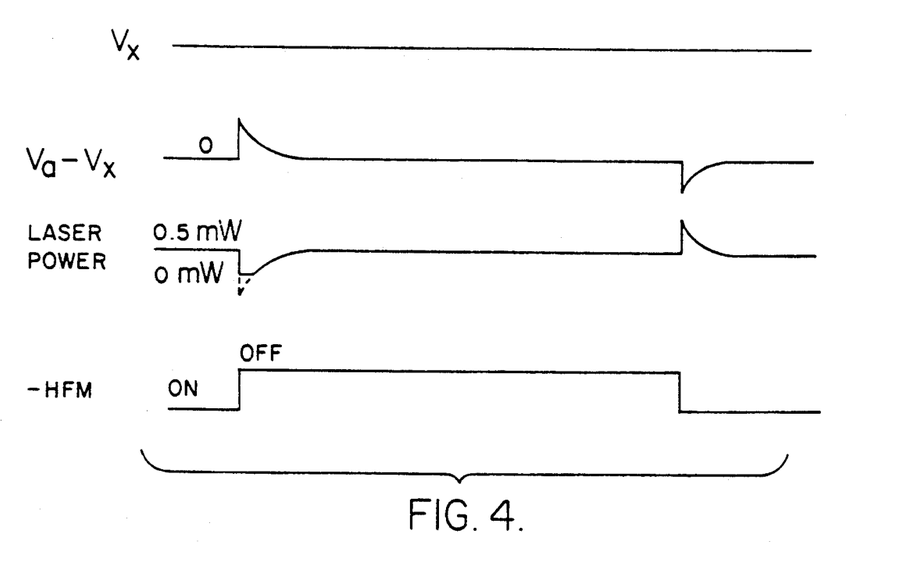
FIG. 4 is a diagram similar to FIG. 3, showing typical operation when writing WORM media.

FIG. 4 shows the typical waveforms which may be produced by the circuit of FIG. 2 when writing to a write-once medium. In this case, the value of $V_X$ is typically kept constant, and the laser power level is kept at a value of perhaps 0.5 milliwatts whether performing a read operation or performing a baseline write operation. However, when switching from a read operation to a baseline write operation, a transient occurs since the high frequency modulation is turned off. Such a situation is shown in the waveforms in FIG. 4, where the change in power, due to shutting off the high frequency modulation, drives the laser to 0 milliwatts and shuts the power off. The solution to this problem, provided by the inventors herein, is to provide another source of current $I_2$ for driving the laser during the transient period to an extent sufficient to eliminate the transient.

Figure 5:
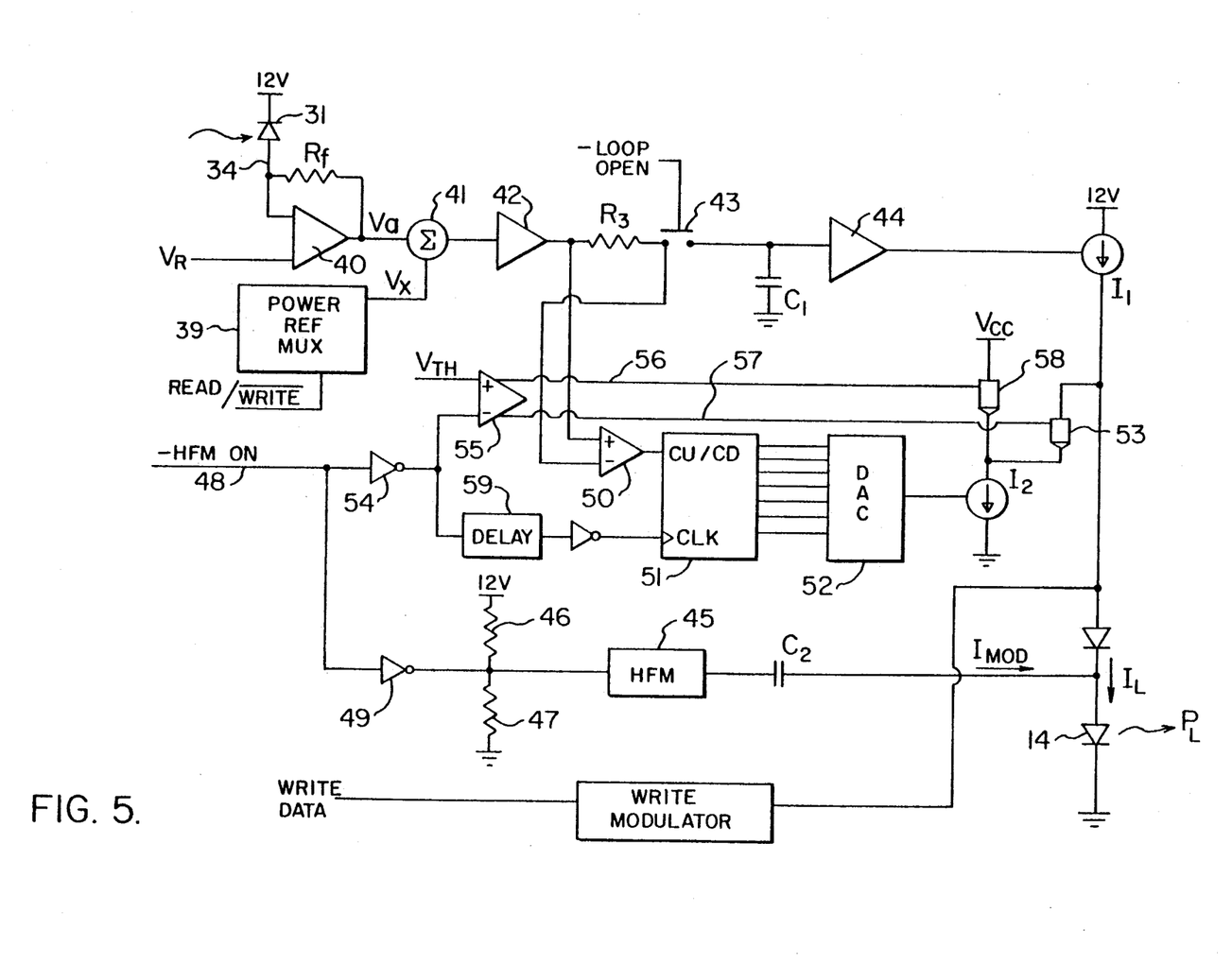
FIG. 5 shows a laser power servo circuit modified to include transient compensation in accordance with this invention.

FIG. 5 shows the modified circuit of FIG. 1, modified in accordance with the invention, to provide a current $I_2$ for compensating transients. As described previously, a portion of the light generated by the semiconductor laser diode 14 is received by photodetector 31. Current produced by photodetector 31, proportional to the light received, is amplified and summed with a reference voltage at summation circuit 41 producing an error voltage to amplifier 42. That error voltage is then placed across capacitor $C_1$ and used to drive a transconductance amplifier 44 in order to modify the current $I_1$ in accordance with the error condition. In order to compensate for transient conditions, the error voltage charging capacitor $C_1$ through resistor $R_3$ is sensed by comparator 50 to stimulate an up/down, counter 51. The output of counter 51 is connected to DAC 52 for controlling the amplitude of the current $I_2$. Whenever transistor switch 53 is closed, the current $I_2$ sums with the current $I_1$ in order to compensate for transients present in the power control loop.

In FIG. 5, whenever the control signal 48 is high, the HFM modulator 45 is turned off. This is the condition for a baseline write operation. Also, inverter 54 produces a low signal as input to comparator 55. At comparator 55, the signal from inverter 54 is compared to a threshold voltage resulting in a high signal on line 56 and a low signal on line 57. The result is that transistor switch 58 is closed and transistor switch 53 is open. The further result is that the current $I_2$ is shunted to the power supply, Vcc.

When the HFM control signal is low, the output of comparator 55 is inverted with line 56 low and line 57 high. The result is that transistors 58 and 53, forming a differential current switch, change state, with transistor switch 58 off and transistor switch 53 closed. The further result is that the current $I_2$ alters the current flow to the laser diode in order to compensate for transients.

The HFM control signal 48 is also passed to a delay circuit 59 through inverter 54 in order to clock the counter 51. This results in the counter 51 counting up or down, depending on the error signal received from the comparator 50, as discussed above.

Figure 6:
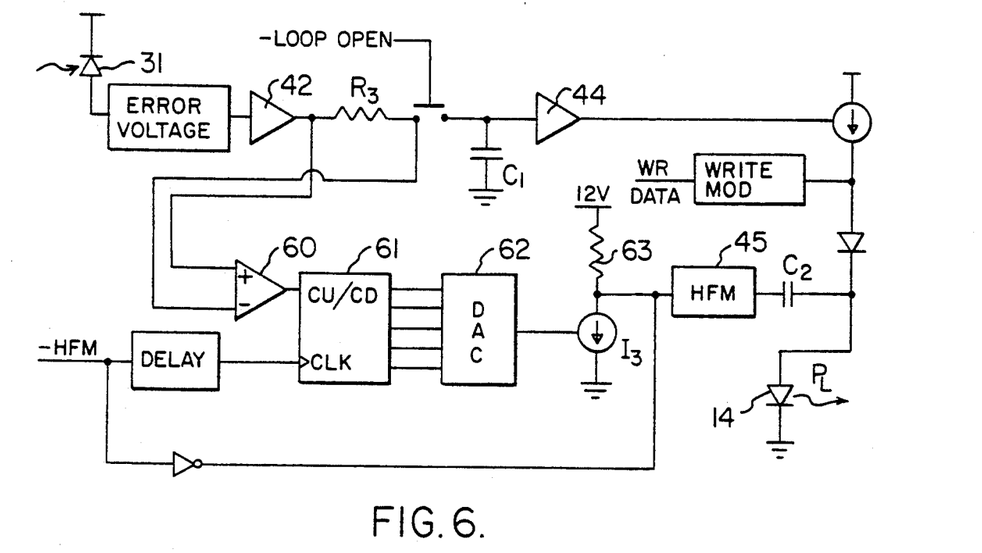
FIG. 6 shows a laser power servo circuit modified to include automatic calibration of high frequency modulation according to this invention.

The circuit shown in FIG. 6 is similar to the circuit just described in FIG. 5, but is used to control the depth of high frequency modulation, as opposed to controlling the value of $I_2$. In FIG. 6, it will be observed that if there is no error voltage in the system, the system will be at a steady state with no appreciable voltage across resistor R3 and, thus, a zero input voltage will be provided to comparator 60. With a zero input voltage, comparator 60 will yield either a one or a zero output for application to the counter 61. The result is that the count from counter 61 will toggle one count up and one count down between the two best DAC values. The effect of current $I_3$ is to change current through the resistor 63 to change the setting of the gain for the high frequency modulator circuit 45. Thus, if an error voltage is present across resistor R3, that error voltage would affect the up/down counter 61, change the DAC setting 62, and thus change the value of the current $I_3$. As a result, the voltage across resistor 63 would change, affecting the gain of the high frequency modulator 45 in order to correct the depth of modulation in accordance with the error voltage. In this manner, as temperature and age affect the output of laser 14, those conditions are reflected in an error voltage which, through the self-calibrating circuit of FIG. 6, calibrates the gain of the high frequency modulation to compensate for those changed conditions. Similarly, when feedback from the optical disk affects the error voltage, the gain of a high frequency modulator is automatically changed to compensate for that condition.

The circuit of FIG. 6 can be used to compensate for transients with an MO disk when going from a read power value of, for example, 2 milliwatts, to a baseline write value of, for example, 0.5 milliwatts. If the 4-1 power setting change occurs when the HFM is switched off, the two transients will compensate one another if the modulation depth is 400%. To utilize this technique to eliminate the transient, the depth of high frequency modulation is adjusted until the circuit eliminates the transient, that is, the output goes from 2 milliwatts to 0.5 milliwatts on the change of reference voltage.

Figure 7:
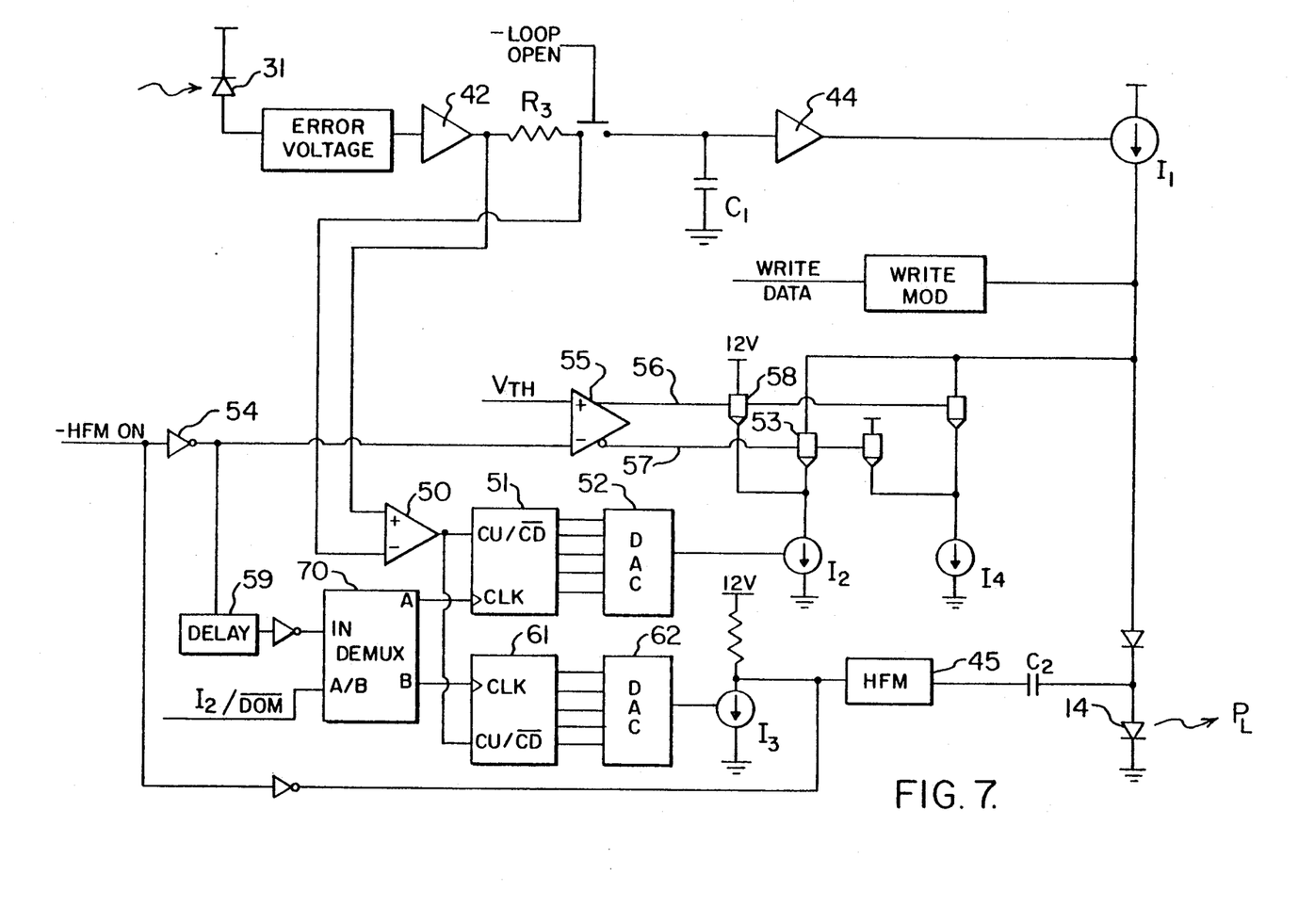
FIG. 7 shows a laser power servo circuit incorporating both automatic calibration of high frequency modulation and transient compensation.

In FIG. 7, both transient compensation feed-forward current and automatic calibration of depth of modulation are included in a single circuit. Comparator 50 is connected to sense the error voltage charging capacitor $C_1$ across resistor R3. The output of comparator 50 is fed to up/down counters 51 and 61, which control the setting of DACs 52 and 62, respectively. DAC 52 controls the current level $I_2$ so that the transient for the change in power setting is compensated whether the change in power setting is a positive change or a negative change.

The updating of the counts in counters 51 and 61 is controlled through a demultiplexor 70. The control logic alternately adjusts either the feed-forward circuit or the depth of modulation circuit with each change in power setting.

It is desirable to switch off the HFM during a write or erase operation for two reasons—to reduce the peak power required by the laser, and to eliminate any "write jitter" induced by the HFM interfering with the laser power modulation used to write marks. Thus after reading a sector header of a sector to be written (or erased), the HFM must be turned off before the writing of the data field begins. The trace shown in FIG. 8b shows a simulation of the transient conditions present for instantaneous laser power emitting from the head/laser assembly 14 and incident on the optical disk 10 recording layer for the prior art circuit of FIG. 2. For $0 < \text{time} < 1$ $\mu s$ the laser power servo is stable at a 0.5mW laser power level. At 1 $\mu s$, the HFM is turned on and a sinusoidal modulation current is coupled into the drive current of the laser $I_L$. If the modulation current produced less than 0.5mW of instantaneous laser power fluctuation, the average laser power would be unchanged. But, the laser noise reduction achieved by use of HFMs is due to turning the laser off momentarily each cycle of the HFM. The current from the HFM simulated in FIG. 8 produces a positive peak of about 6 mW on the instantaneous laser power (above the original 0.5 mW steady state power). The negative peaks of the HFM current do not produce negative peaks on the instantaneous laser power. Instead, the laser is turned off (as shown in the magnification insert in FIG. 8b) until the current returns to a level sufficient to yield a positive instantaneous laser power. A calculation of the average laser power (the integral of the instantaneous laser power over a cycle) at the moment following the HFM being switched on would yield a laser power much higher than 0.5 mW, even though the average laser drive current $I_L$ has not changed. This is because emitted laser power does not go negative and thus the translation of the sinusoidal modulation current into laser power yields a truncated sinusoid on top of $I_1$. The truncated sinusoid causes the average laser power to increase by about 1.5 mW (this can be seen in the trace of FIG. 8 where the average laser power setting is adjusted simultaneously to 2 mW via switching $V_x$). Indeed, this change in average laser power due to the HFM without changing the average drive current is explicit in the definition of depth of modulation (DOM), which is a function of the amplitude of the modulation current:

$$DOM(Imod) = \frac{P_L, hfm \text{ on}}{P_L, hfm \text{ off}} \times 100\% (\text{average } I_L \text{ fixed}) \quad (2)$$

where the average laser drive current is denoted as $I_L$, the average laser power emitted as $P_L$, and amplitude of modulating current as Imod. (Equation 2 is another manner of expressing Equation 1, and the term depth of modulation (DOM) is the same as modulation depth (DM)). In FIG. 8b, the operation of the laser power servo can be seen as $I_1$ is decreased following the HFM being turned on until an average laser power of 0.5 mW with the HFM on is achieved. The transient in average laser power, following turning the HFM on, lasts for about 8 $\mu s$ and is dangerous in that it could erase or damage data. At time 20 $\mu s$ on the simulated trace, the HFM is switched off. The laser power is 0. This indicates that the current $I_1$ was reduced by operation of the laser power servo until $I_1$ by itself was not enough current for the laser to operate. The simulation shows that the laser is off for about 8 $\mu s$ and only settles to 0.5 mW after about 12 $\mu s$ (from HFM off). Turning the laser off for 8 $\mu s$ causes problems for the drive tracking and focus servos. Without 8 $\mu s$, the servo can lose lock on focus or tracking or both. This is exacerbated because the servo preamplifier typically normalizes the servo signals by dividing by total power to the servo photodetectors (which in this case is 0, causing the division to theoretically approach infinity and in practice saturate the circuits). There is some danger that the data record in the adjacent track may be damaged if a write or erase is initiated after the servo is perturbed via a momentary loss of laser light.

After each HFM control transition, a transient on the average laser power exists which the laser power servo eliminates after some period of time. The time required to settle to the threshold power is dependent on the laser power servo parameters (bandwidth, gain, slew rates, etc.) and the size of the initial disturbance (essentially a step function at the time the HFM is turned off). Without compensation, the settling time required after the HFM is turned on or off can be excessive (on the order of 15 microseconds). This invention describes two techniques which can greatly reduce the transient in average laser power. The first feeds forward a current to the laser to cancel the power transient. This can considerably reduce the initial disturbance due to turning the HFM off, and thus the time required to settle. Also, the invention provides an automated method of calibrating the feed forward current for a minimum disturbance so that the feed forward current is adjusted at each transition of the HFM (or every other one).

To explain how feeding forward a current $I_2$ can compensate for the power transient due to a HFM transition, consider the WORM case where the power transient is always negative when an AC coupled HFM is turned off. FIG. 5 shows a circuit which has a current switch which shunts current out of the laser drive current when the HFM is turned on. The operation of the laser power servo will increase the current $I_1$ until the proper laser power is achieved, regardless of the shunted current (in this way $I_2$ appears as additional threshold current of the laser). The circuit does not shunt $I_2$ out of the laser current when the HFM is off. Thus, the current into the laser increases by $I_2$ when the HFM is turned off. If $I_2$ is set properly, the step power increase due to $I_2$ will compensate for the power decrease due to turning the HFM off, leaving little power error to be servo'd out. Conversely, when the HFM is turned on, the current $I_2$ is again shunted out of the laser drive current. The step laser power decrease due to $I_2$ will compensate for the increase in laser power due to turning the HFM on. In this way, $I_2$ can be used to compensate for the power transients due to HFM transitions.

Figure 8A:
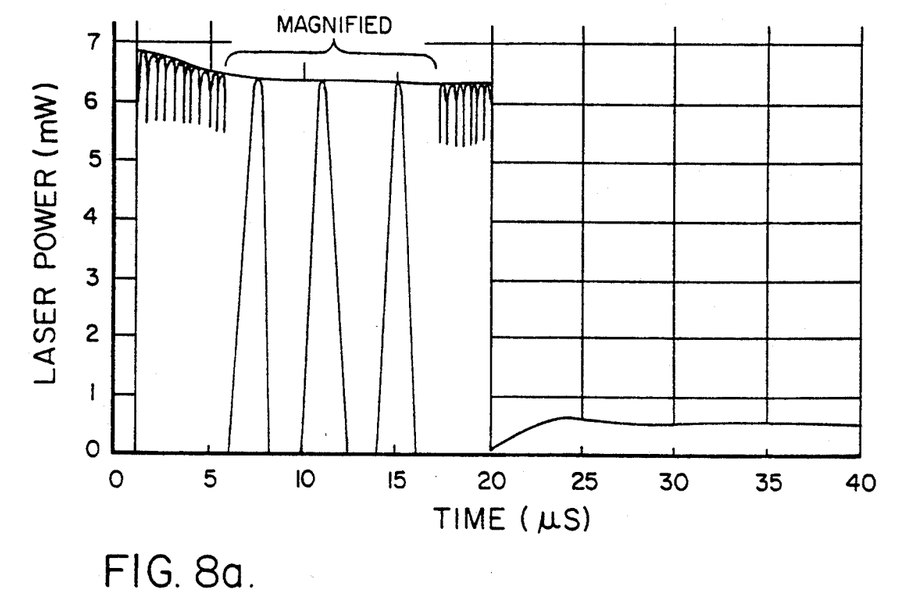
FIG. 8a and 8b show two traces of computer simulated conditions for laser power vs. time when the laser generator is not compensated in accordance with this invention.
Figure 8B:
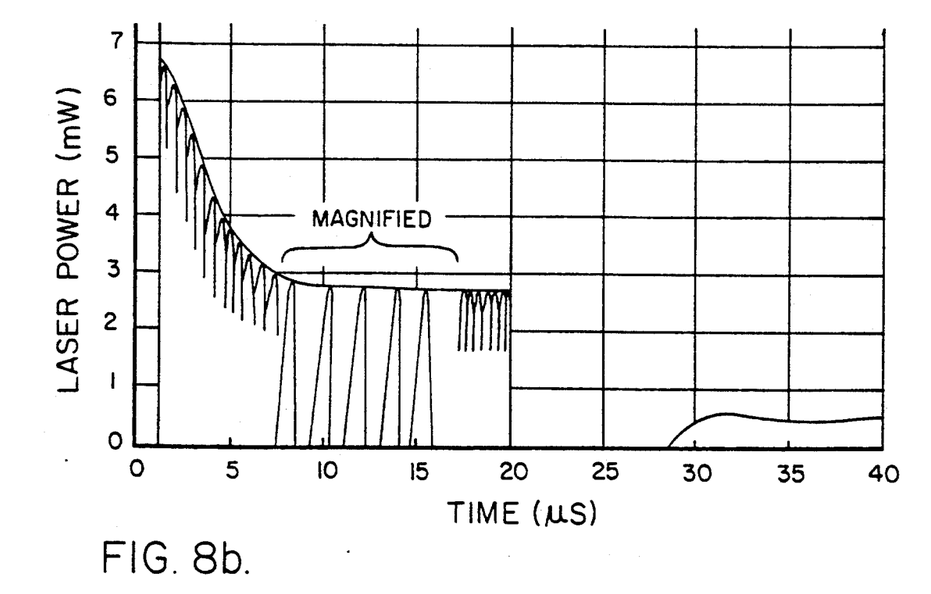
Figure 9A:
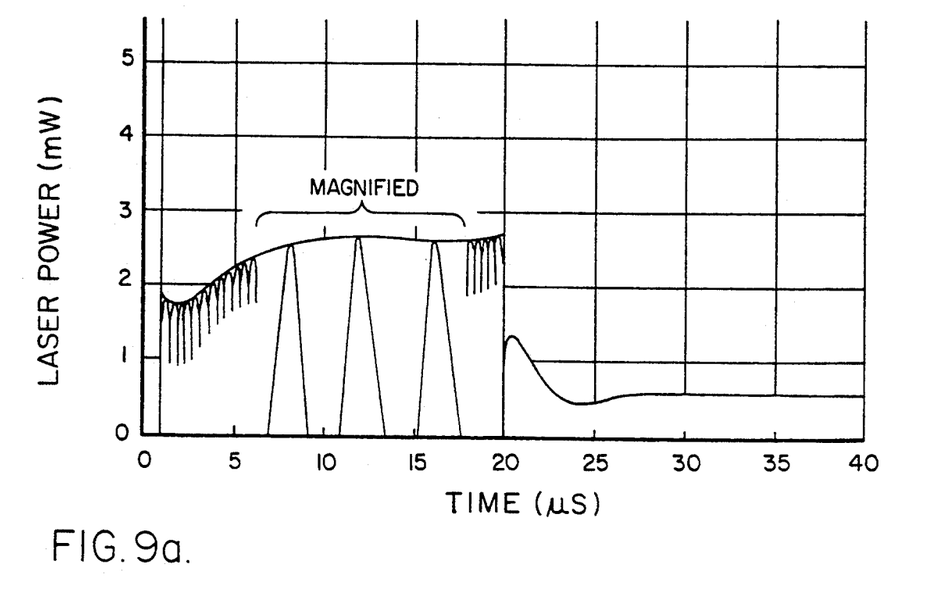
FIG. 9a and 9b show two traces of computer simulated conditions for laser power vs. time when the laser generator is 1) over compensated, and 2) compensated correctly in accordance with this invention.
Figure 9B:
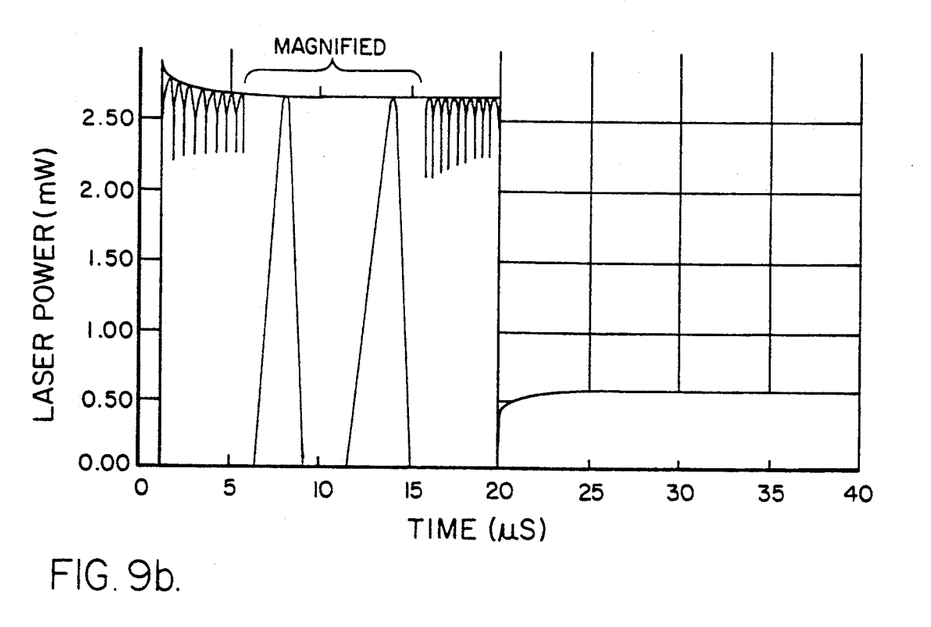

FIG. 8, discussed above, shows simulations, of an MO write, FIG. 8a, and a WORM write FIG. 8b, without $I_2$ compensation. FIG. 9 shows a WORM write with the correct $I_2$ compensation, FIG. 9b, and too much $I_2$ compensation.

Current $I_2$ can be automatically calibrated using comparator 50, up/down counter 51, and DAC 52. When the HFM is turned off (and the laser current is increased by $I_2$), the error voltage transient reflects whether the laser is at too great a power (negative error voltage), too low a power (positive error voltage), or just right (0 error voltage). The polarity of the error voltage is sampled via comparator 50 as either positive or negative. Counter 51 is either incremented or decremented based on this polarity. The count of counter 51 drives DAC 52 which sets $I_2$. A negative error voltage transient gives a down count, because the increase in laser power due to $I_2$ exceeds the decrease in laser power due to the HFM being turned off. Conversely, a positive error voltage transient gives an up count. By continually monitoring the error voltage transient and updating the count of counter 51, $I_2$ will be forced to within one DAC count of the proper current to compensate for HFM transitions.

Using the same feedback technique, but having the DAC instead drive the HFM, the DOM can be adjusted. This is the second technique which is used to eliminate the power transient; and FIG. 6 shows how this can be done. As mentioned above, when writing an MO disk, the sector header is typically read with 2.0 mW of laser power with the HFM on, and the data field is typically written from a 0.5 mW write threshold with the HFM off. This power transient can be achieved by setting the HFM DOM to 400% (by definition of DOM). In direct analogy with the argument expressed above for $I_2$—when the HFM is turned off (and the power setting of the laser driver control loop is switched), the error voltage transient reflects whether the laser is at too great a power relative to the new power setting (negative error voltage), too low a power (positive error voltage), or just right (0 error voltage). DOM can be automatically calibrated using comparator 60, up/down counter 61, and DAC 62 just as was done for $I_2$ above.

Note that the $I_2$ feed forward technique shown in FIG. 5 was described for the case of WORM media where the power transient is always negative when the HFM is turned off (without feed forward) and hence a current $I_2$ added to the laser driver will always provide some cancellation of the power transient. For the MO case, where a power setting transition occurs simultaneously with the HFM transition, the power transient can be positive (e.g., the 2 mW to 0.5 mW operation described above if the DOM was less than 400%). In this case, $I_2$ should be subtracted from the laser current when the HFM is turned off. The action of the circuit in FIG. 5 would be to set $I_2$ to 0, but it cannot go negative. Thus, a more general circuit is shown in FIG. 7 where $I_2$-$I_4$ can be effectively positive or negative. Also, DOM automatic adjust circuitry is shown in FIG. 7. The two are complementary, though they should be adjusted separately.

One possible scenario where both are used is an MO/WORM drive. For example, when a disk is mounted and the laser is turned on (out of focus) the DOM feedback could be enabled and the HFM ON line and power setting lines could be toggled synchronously. For example, if the power set lines set 2 mW when the HFM is on and 0.5 mW when the HFM is off, the DOM feedback circuitry will adjust the DOM to 400%. Other power settings would yield other DOMs. To allow operation on WORM disks, the laser power is set to 0.5 mW with the HFM on. Focus is acquired. Either the PEP or SFP parts (per ANSI standard on both MO and WORM disks) is read and the media is established to be either MO or WORM. For the WORM case the DOM could be held (feedback disabled) or reduced (the modulation current which yields 400% DOM @ 2 mW will turn off the laser if switched off from an average power of 0.5 mW), and the $I_2$ circuitry could be enabled. After the HFM ON line is toggled enough times the feedback will have set $I_2$ to the proper level to compensate for power transients from HFM ON transitions. For the MO case, the DOM could be adjusted in focus to the proper level. The DOM circuitry could then be disabled and the $I_2$ circuitry enabled. When the HFM ON line is toggled enough times the feedback will have set $I_2$ to the proper level to compensate for power transients from HFM ON transitions not compensated by synchronous power setting switching. Using numbers, if the DOM was set to 400% out-of-focus, a smaller DOM would result in focus (because of the P-I curve shift out-of-focus to in-focus), perhaps 300% at 2 mW, though it would still turn off the laser without $I_2$ feed-forward when the HFM is turned off from 0.5 mW operation. If an inserted disk is MO and it is decided that 200% DOM is desired, the power setting of 2.0 mW to 1.0 mW must be used while the DOM calibrates. The DOM circuit should then be disabled and the $I_2$ (clearly negative in this case) circuit should be allowed to calibrate for power transient cancellation.

Note that the description has described an AC coupled HFM. A DC coupled HFM produces power transients also, and this could be cancelled using $I_2$ feed forward just as was done in the AC case. The HFM DOM could also be adjusted, though calibrating to a given DOM is more difficult because switching on and off the modulator affects the average drive current to the laser as well as the average laser power.

Note also that the concept of measuring the polarity of a transient in the laser power control loop can be extended to any point in the loop, and does not need to be at the output of the transimpedence amplifier. For instance, a sample and hold circuit such as the LOOP OPEN S/H could be used to sample the amplified error voltage before and after the HFM is switched on (or off). Additionally, note that the circuitry shown here calibrated the HFM DOM based on only the turn on transient. This concept could be easily extended to calibrate at both transients (i.e., turn off also).

Figure 10:
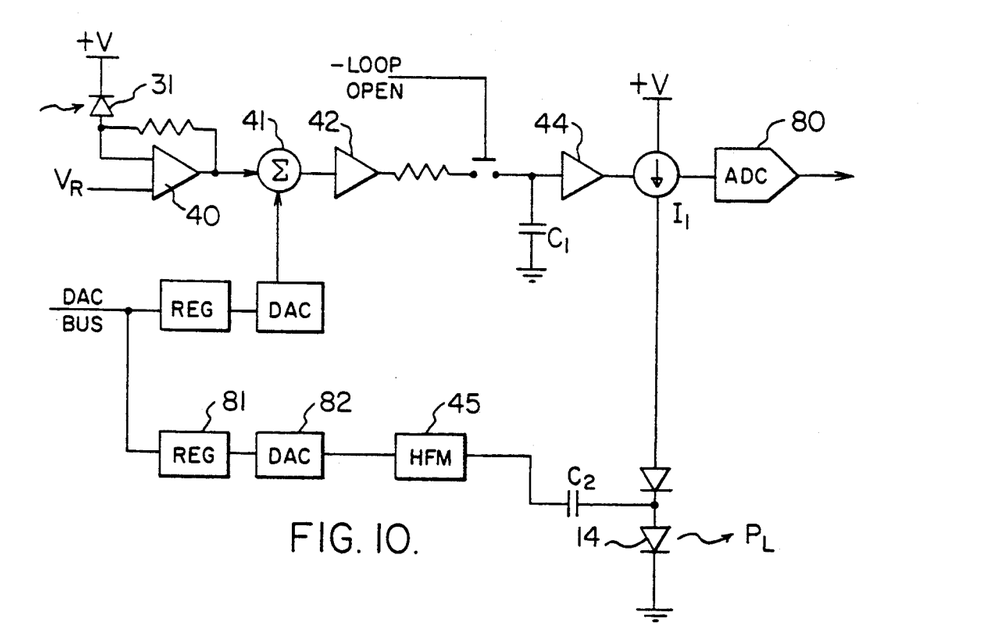
FIG. 10 is a block diagram of an alternative circuit for the calibration of HFM power.
Figure 11:
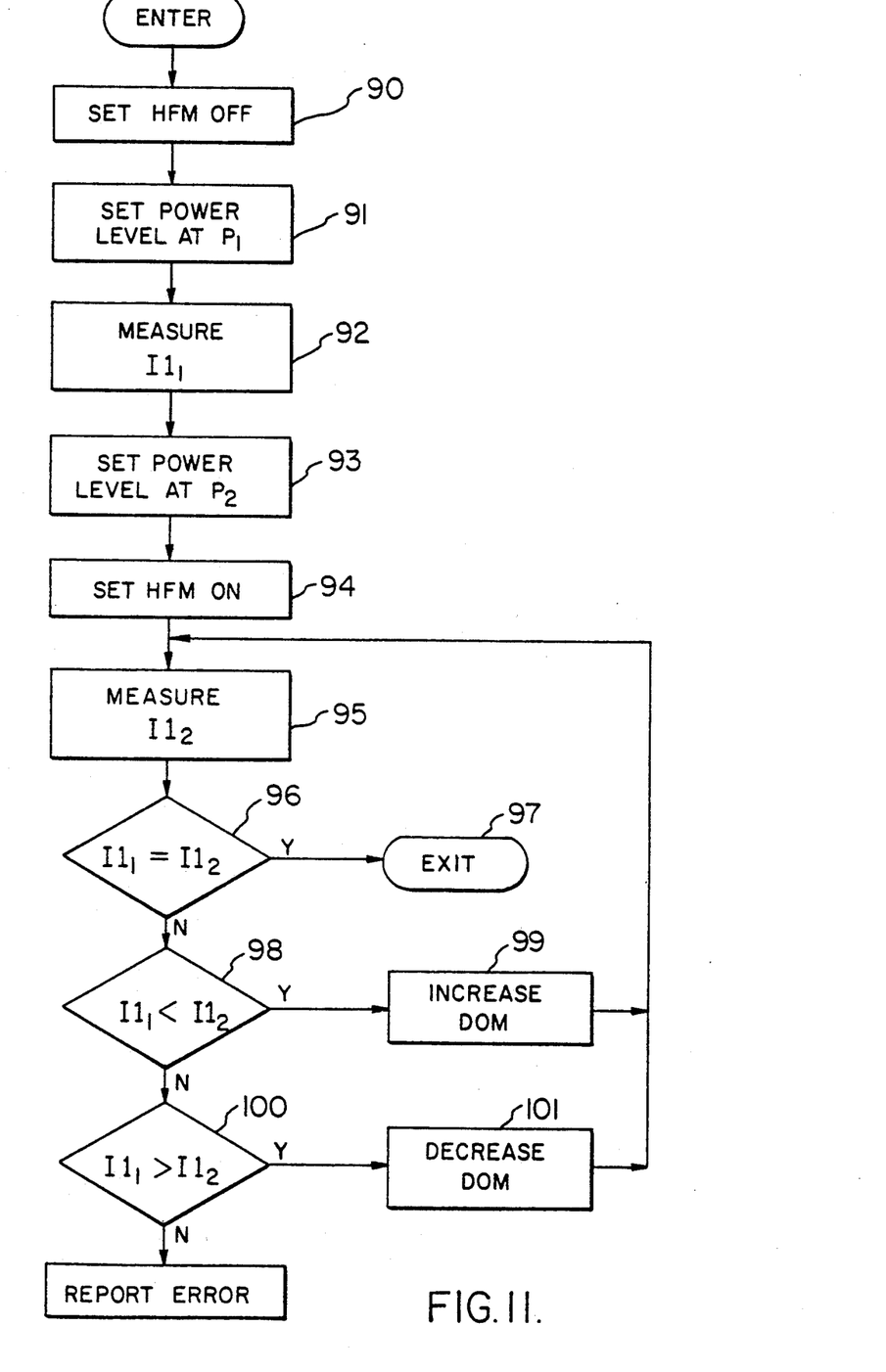
FIG. 11 shows a flow chart of the procedure followed to calibrate HFM power in the circuit of FIG. 10.

An alternative approach is shown in FIG. 10 for automatically calibrating depth of modulation. In the circuit of FIG. 10, DOM is calibrated as a function of read power. FIG. 10 shows an analog to digital converter (ADC) 80 connected to measure laser bias current $I_1$. he output of ADC so is fed to the processor 20 shown in FIG. 1 where a procedure, shown in FIG. 11, is followed to provide an adjustment to the depth of modulation if an adjustment is required. The processor output for DOM is sent over the DAC bus to register 81 for setting DAC 28 which in turn controls the gain of HFM oscillator 45.

FIG. 11 shows the procedure followed in microprocessor 20 to calibrate the depth of modulation. In the first step of the procedure, step 90, the HFM is turned off. Next, the power level is set to the power level $P_1$, at step 91. The ADC circuit 80 is then used to measure the current $I_1$ to provide a quantity designated $I1_1$, at step 92. In accordance with equation 1 set out above, the power level $P_1$ is the power level produced by the circuit with modulation off and $I_1$ is the DC bias laser current which produces that power level. With equation 1, the relationship between % MD, $P_1$ and $P_2$ is established. Thus, if % MD and $P_2$ are given, $P_1$ can be found from equation 1. Next in the procedure, at step 93, the power level is adjusted to level $P_2$. $P_2$ is the laser power with modulation and is therefore a desired read power level whereas power level $P1$ is the desired base line write power level. The HFM circuit is turned on at step 94 and at step 95, the ADC circuit 80 is used to measure current level $I_1$. The quantity measured at step 95 is termed $I1_2$. At step 96 the measured current from step 92, which is $I1_1$, is compared to the current measured at step 95, that is $I1_2$. If the two are equal or within a tolerance, the procedure is exited at step 97. In such event the depth of modulation is properly set since the current levels are the same whether the modulation is on or off. If, however, the current level with the modulator off is less than the current level with the modulator on, as determined at step 98, then it is necessary to increase the depth of modulation as shown at step 99. The processor will then provide an increment to the DAC 82 over the DAC bus in order to increase the depth of modulation produced by oscillator 45.

If the current with the modulator off is greater than the current with the modulator on, as shown at step 100, then it is necessary for the processor to decrease the depth of modulation at step 101. This is accomplished by decreasing the level supplied to DAC 82 over the DAC bus in order to decrease the gain of oscillator 45.

Once the procedure shown in FIG. 11 is executed, the laser bias current is equal whether the modulation is on or off. Thus, all of the conditions for equation 1 are satisfied and the modulation depth is set at the desired level and at the desired read power level. This technique enables setting the modulation depth to a level that is responsive to changes in the laser due to temperature and aging. Under control of the processor, modulation depth is set to the proper level to obtain optimum noise reduction of the laser for read power level.

Another advantage is fast switching of laser power levels between read and write modes. In optical drives, the sector ID field and the data field are read with the HFM on at a read power level $P2$. When a record is erased or written, the laser power level is set to another power level with the HFM off. Generally, that power level is lower than the read power level and if this threshold power level $P1$ and the modulation depth are appropriately selected, a fast switching time of laser power levels can be obtained by switching the laser power level and the HFM at the same time in order to eliminate the transient. Fast laser power level switching times are critical when switching the laser power level from a read mode when reading the track ID, to writing or erasing the data field.

While the invention has been described above with respect to specific embodiments, it will be understood by those skilled in the art that various changes in form and details may be made therein without departing from the spirit and scope of the invention which receives definition in the following claims.

What is claimed is:

1. A drive circuit for supplying drive current to a laser used for illuminating an optical disk at a first relatively high power level for writing data onto said disk and a second relatively low power level for reading data stored on said disk, said drive circuit capable of rapidly switching current levels to drive said laser at the alternate power levels, said circuit comprising:

power reference circuit means electrically connected to said laser for establishing a reference voltage and a corresponding laser drive current for driving said laser to produce a first write level laser light power output and a second read level laser light power output;

control logic means connected to said power reference circuit means for selecting power levels for read mode or write mode;

a photodetector optically coupled to said laser for receiving light indicative of generated laser power;

a laser power servo loop electrically connected to said photodetector and to said power reference circuit means for summing a voltage proportional to the output of said photodetector with said reference voltage to obtain an error voltage, said loop including means for altering said laser current in response to said error voltage to modify the production of light to eliminate said error voltage;

transient compensation current generating means for eliminating temporary alterations of the drive current level when switching between said power levels, said transient compensation current generating means connected to said servo loop for receiving a voltage proportional to said error voltage and for producing a compensation current level in response to said error voltage, said compensation current connected to modify said laser current to eliminate said temporary alterations.

2. The circuit of claim 1 wherein said transient compensation means further includes:

a compensation circuit up/down counter means responsive to said error voltage to change a compensation output count up or down in accordance with a positive or negative error voltage transient condition;

compensation circuit digital to analog (DAC) converter means connected to said compensation circuit up/down counter means to produce a compensation DAC output voltage proportional to said compensation output count; and said transient compensation current generator means connected to said compensation DAC means for generating said compensation current proportional to said compensation DAC output voltage.

3. The circuit of claim 1 further including:

high frequency modulation (HFM) means connected to said laser for producing a modulation current for modulating said drive current during said read mode, said HFM means off during said write mode; and automatic calibration means connected to said servo loop and to said HFM means for changing the setting of depth of modulation for said modulation current in response to changes in said error voltage when switching form read mode to write mode or vice versa, to eliminate said change in error voltage.

4. The circuit of claim 3 wherein said automatic calibration means further includes:
  HFM circuit up/down counter means responsive to said error voltage to change an HFM output count up or down in accordance with a positive or negative change in error voltage;
  HFM circuit digital to analog (DAC) converter means connected to said HFM circuit up/down counter means for producing an HFM DAC output voltage proportional to said HFM output count; and
  an HFM calibration current generator means connected to said HFM DAC means for generating calibration current in response to said DAC to change depth of modulation to eliminate said error voltage.

5. The circuit of claim 4 wherein said transient compensation means further includes:
  a compensation circuit up/down counter means response to said error voltage to change a compensation output count up or down in accordance with a positive or negative error voltage transient condition;
  compensation circuit digital to analog (DAC) converter means connected to said compensation circuit up/down counter means to produce a compensation DAC output voltage proportional to said compensation output count; and
  said current generator means connected to said compensation DAC means for generating said compensation current proportional to said compensation DAC output voltage.

6. The circuit of claim 3 wherein said transient compensation means further includes:
  a compensation circuit up/down counter means responsive to said error voltage to change a compensation output count up or down in accordance with a positive or negative error voltage transient condition;
  compensation circuit digital to analog (DAC) converter means connected to said compensation circuit up/down counter means to produce a compensation DAC output voltage proportional to said compensation output count; and
  said current generator means connected to said compensation DAC means for generating said compensation current proportional to said compensation DAC output voltage.

7. The circuit of claim 3 wherein said calibration means further includes an analog to digital (ADC) converter means connected to said laser power servo loop to produce an ADC output proportional to the DC bias current of said laser, said ADC output connected to said control logic means; and
  said control logic means for generating an output signal connected to said HFM means for establishing a modulation current in accordance with said DC bias current.

8. The circuit of claim 7 wherein said HFM means further includes:
  an HFM digital to analog (DAC) converter means for receiving said output signal from said control logic means and generating an HFM output voltage to control the depth of modulation of said modulation current.

9. The circuit of claim 8 wherein said transient compensation means further includes:
  a compensation circuit up/down counter means responsive to said error voltage to change a compensation output count up or down in accordance with a positive or negative error voltage transient condition;
  compensation circuit digital to analog (DAC) converter means connected to said compensation circuit up/down counter means to produce a compensation DAC output voltage proportional to said compensation output count; and
  said current generator means connected to said compensation DAC means for generating said compensation current proportional to said compensation DAC output voltage.

10. The circuit of claim 7 wherein said transient compensation means further includes:
  a compensation circuit up/down counter means responsive to said error voltage to change a compensation output count up or down in accordance with a positive or negative error voltage transient condition;
  compensation circuit digital to analog (DAC) converter means connected to said compensation circuit up/down counter means to produce a compensation DAC output voltage proportional to said compensation output count; and
  said current generator means connected to said compensation DAC means for generating said compensation current proportional to said compensation DAC output voltage.

11. A drive circuit for a laser used for illuminating an optical disk comprising:
  power reference circuit means electrically connected to said laser for establishing a reference voltage and laser current for driving said laser generator to produce a reference laser light power output;
  control logic means connected to said power reference circuit means for establishing read mode or write mode;
  a photodetector optically coupled to said laser generator for receiving light indicative of generated laser power and for receiving feedback light reflected from said optical disk;
  a laser power servo loop electrically connected to said photodetector and to said power reference circuit means for summing a voltage proportional to the output of said photodetector with said reference voltage to obtain an error voltage, said loop including current generating means for altering said laser current in response to said error voltage to modify the production of light to eliminate said error voltage;
  high frequency modulation (HFM) means connected to said laser for producing a modulation current for modulating said drive current during said read mode, said HFM means off during said write mode; and
  automatic calibration means connected to said servo loop and to said HFM means for changing the setting of depth of modulation for said modulation current in response to changes in said error voltage when switching from read mode to write mode or vice versa, to eliminate said changes in error voltage.

12. The circuit of claim 11 wherein said automatic calibration means further includes:
   HFM circuit up/down counter means responsive to said error voltage to change an HFM output count up or down in accordance with a positive or negative change in error voltage;
   HFM circuit digital to analog (DAC) converter means connected to said HFM circuit up/down counter means for producing an HFM DAC output voltage proportional to said HFM output count; and
   an HFM calibration current generator means connected to said HFM DAC means for generating calibration current in response to said DAC to change depth of modulation to eliminate said error voltage.

13. The circuit of claim 11 wherein said calibration means further includes an analog to digital (ADC) converter means connected to said laser power servo loop to produce an ADC output proportional to the DC bias current of said laser, said ADC output connected to said control logic means; and
   said control logic means for generating an output signal connected to said HFM means for establishing a modulation current in accordance with said error voltage.

14. The circuit of claim 13 wherein said HFM means further includes:
   an HFM digital to analog (DAC) converter means for receiving said output signal from said control logic means and generating an HFM output voltage to control the depth of modulation of said modulation current.

* * * * *